United States Patent
Martin et al.

(10) Patent No.: US 6,376,787 B1
(45) Date of Patent: Apr. 23, 2002

(54) MICROELECTROMECHANICAL SWITCH WITH FIXED METAL ELECTRODE/ DIELECTRIC INTERFACE WITH A PROTECTIVE CAP LAYER

(75) Inventors: Wallace W. Martin, Richardson; Yu-Pei Chen, Plano; Byron Williams, Plano; Jose Melendez, Plano; Darius L. Crenshaw, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 92 days.

(21) Appl. No.: 09/648,288

(22) Filed: Aug. 24, 2000

(51) Int. Cl.[7] .................. H01H 57/00; H01H 11/00; H03K 17/735; H01P 1/10
(52) U.S. Cl. .................. 200/181; 29/622; 200/600; 333/262
(58) Field of Search .................. 200/181, 600; 333/101, 108, 262; 361/288; 29/622

(56) References Cited

U.S. PATENT DOCUMENTS

| 5,619,061 A | 4/1997 | Goldsmith et al. ......... 257/528 |
| 5,638,946 A * | 6/1997 | Zavracky .................. 200/181 |
| 6,100,477 A * | 8/2000 | Randall .................... 200/181 |

* cited by examiner

*Primary Examiner*—J. R. Scott
(74) *Attorney, Agent, or Firm*—W. Daniel Swayze, Jr.; W. James Brady; Frederick J. Telecky, Jr.

(57) ABSTRACT

A Micro Electro-Mechanical System (MEMS) switch (100) having a bottom electrode (116) formed over a substrate (112) and a thin protective cap layer (130) disposed over the bottom electrode (116). A dielectric material (118) is disposed over the protective cap layer (130) and a pull-down electrode (122) is formed over the spacer (120) and the dielectric material (118). The protective cap layer (130) prevents the oxidation of the bottom electrode (116). The thin protective cap layer (130) comprises a metal having an associated oxide with a high dielectric constant. A portion (132) of the thin protective cap layer (130) may oxidize during the formation of the dielectric material (118), increasing the capacitance of the dielectric stack (128).

20 Claims, 2 Drawing Sheets

FIG. 3

MICROELECTROMECHANICAL SWITCH WITH FIXED METAL ELECTRODE/ DIELECTRIC INTERFACE WITH A PROTECTIVE CAP LAYER

TECHNICAL FIELD

This invention relates generally to integrated circuits, and more particularly to Micro Electro-Mechanical System (MEMS) switches.

BACKGROUND OF THE INVENTION

Rapid advances in the field of telecommunications have been paced by improvements in the electronic devices and systems which make the transfer of information possible. Switches that allow the routing of electronic signals are important components in any communication system. Switches that perform well at high frequencies are particularly valuable. Although the p-i-n diode is a popular RF switch, it has problems with high power consumption because the diode must be forward biased to provide carriers for the low impedance state. Furthermore, the p-i-n diode suffers from high cost and nonlinearity.

Recently, (MEMS) switches have been developed for switching RF signals. FIG. 1 shows a cross-sectional view of an RF drumhead capacitive MEMS switch 10, disclosed by Goldsmith et al. in U.S. Pat. No. 5,619,061. An insulator 14 such as $SiO_2$ is deposited over a substrate 12 such as silicon. A bottom electrode 16 is formed on insulator 14 and a dielectric 18 is formed over bottom electrode 16. Capacitor dielectric 18 typically comprises $Si_3N_4$, $Ta_2O_5$ or other suitable dielectric materials, for example. An active element comprising a thin metallic membrane 22 is suspended away from electrode 16 by insulating spacers 20. Membrane 22 is movable through the application of a DC electrostatic field across membrane 22, which serves as a top electrode, and bottom electrode 16. Membrane 22, dielectric 18 and bottom electrode 16 comprise a metal-dielectric-metal capacitor when the MEMS switch 10 is in the "on" position. MEMS switches 10 have low insertion loss, good isolation, high power handling, and very low switching and static power requirements.

SUMMARY OF THE INVENTION

The present invention achieves technical advantages as a MEMS switch having a protective cap formed on the bottom electrode to prevent oxidation of the bottom electrode material, improving the capacitive effects of the MEMS switch. The protective cap comprises a material having a higher resistance to oxidation than the bottom electrode material or a material having an associated oxide, which oxide is a high dielectric contant (k) dielectric material (e.g. at least 20).

Disclosed is a MEMS switch, including a bottom electrode formed over a substrate, and a thin protective cap layer disposed over the bottom electrode. A dielectric material is disposed over the protective cap layer, and a spacer is placed proximate the bottom electrode. A pull-down electrode is disposed over the spacer and the dielectric material. The protective cap layer prevents the oxidation of the bottom electrode.

Also disclosed is a method of manufacturing a MEMS switch, comprising the steps of providing a substrate, depositing an insulator layer on the substrate, and forming a bottom electrode on the insulator layer. A thin protective cap layer is deposited over the bottom electrode, and a dielectric material is deposited over the bottom electrode and thin protective cap layer. A pull-down electrode is formed over the dielectric material. The thin protective cap layer prevents the oxidation of the bottom electrode.

Advantages of the invention include maintaining the capacitance of the dielectric stack of a MEMS switch. The protective cap layer comprises a material having a higher resistance to oxidation than the bottom electrode or a material that forms a high dielectric constant oxide upon oxidation, maintaining or improving the capacitance to the dielectric stack. The protective cap layer is easily implemented and only requires one more processing step.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

Figure 1:
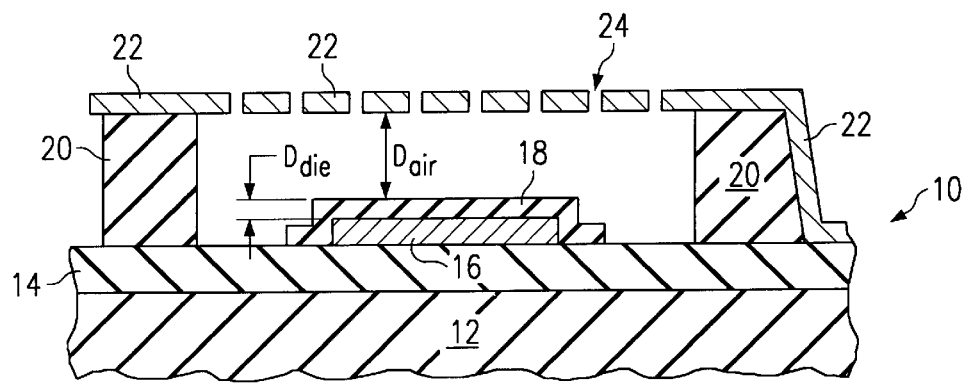
FIG. 1 illustrates a cross-sectional view of a prior art MEMS capacitive RF switch.

The basic principle of a MEMS capacitive RF switch operation will next be described. An RF signal is typically input into the MEMS structure shown in FIG. 1 through bottom electrode 16 or top membrane electrode 22. The RF signal will be transmitted to the other electrode if the membrane 22 is in contact with the dielectric 16 covering the bottom electrode 16. In the "off" (membrane up) position shown in FIG. 1, the "off" capacitance is reflected by:

$$C_{off} \approx \varepsilon_{air} A / D_{air} \qquad \text{Equation 1}$$

where A is the cross sectional area of the bottom electrode (i.e. area where metal is on both sides of the air dielectric), $\varepsilon_{air}$ is the dielectric constant of air, and $D_{air}$, defined in FIG. 1 as the distance between the membrane 22 and the dielectric 16. In the "on" (membrane down) position shown in FIG. 2, the metal membrane electrode 22 is electrostatically deflected to rest atop the dielectric, and the "on" capacitance is reflected by:

$$C_{on} \approx \varepsilon_{die} A / D_{die} \qquad \text{Equation 2}$$

where $\varepsilon_{die}$, is the dielectric constant of the insulator 18 covering the bottom electrode 16 and $D_{die}$ is the thickness of the insulator 18. Membrane 22 is often also called a pull-down electrode or top electrode. The off/on impedance ratio is reflected by the equation:

$$\varepsilon_{die} * D_{air} / \varepsilon_{air} * D_{die} \qquad \text{Equation 3}$$

The off/on impedance ratio may be quite large (greater than 100:1), depending on the physical design of the device and the material properties of the insulator 18. A ratio of 100:1 is typically sufficient for effectively switching microwave signals.

Resistance $R_{on}$ is the resistance of the MEMS device 100 with a voltage applied. Preferably, the materials and device structure are designed to produce a low resistance $R_{on}$ and a high $C_{on}/C_{off}$ ratio. A low resistance $R_{on}$ and high $C_{on}/C_{off}$ ratio produce low insertion loss and high isolation, respectively. In order to produce a low resistance $R_{on}$, a material with a low resistivity, such as Al and its alloys (e.g. Al—Si, Al—Si—Ti) is typically used for the bottom electrode 16 and top membrane 22. To have a $C_{on}/C_{off}$ ratio sufficient enough to effectively switch RF signals, high k dielectric materials, such as $Ta_2O_5$ (with a dielectric constant k of approximately 21–29), $TiO_2$ (k>60) and their sub-oxides ($Ta_xO_y$, $Ti_xO_y$), are often used for the capacitor dielectric 18.

Figure 2:
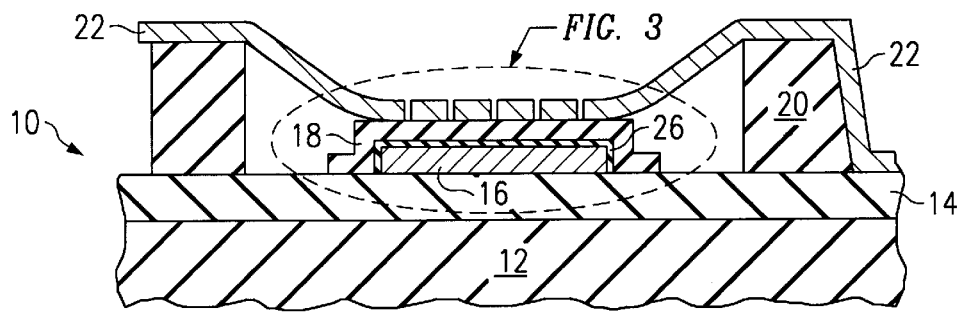
FIG. 2 illustrates a cross-sectional view of a prior art MEMS capacitive RF switch in the "on" state position, having an interfacial oxide layer formed on the bottom electrode beneath the dielectric.
Figure 3:
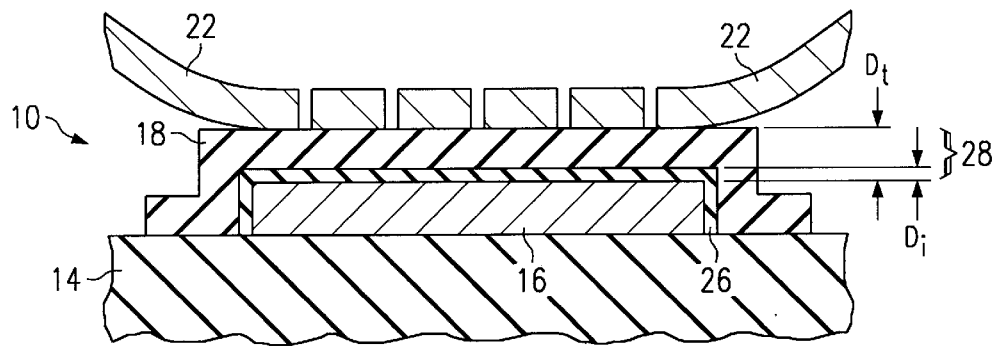
FIG. 3 illustrates a more detailed view of the MEMS switch conductor interfacial oxide layer shown in FIG. 2.

One common method of preparing low temperature $Ta_2O_5$ and $TiO_2$ films for dielectric 18 is reactive sputter deposition. In reactive sputter deposition, $O_2$ is introduced into a sputtering chamber, which reacts with a Ta or Ti metal target and the sputtered atoms to form $Ta_2O_5$ and $TiO_2$ films on a substrate surface 12. Exposing bottom electrode 16, comprising a metal such as Al, to $O_2$ prior to and during the dielectric deposition may cause the electrode 16 metal surface to oxidize and form an $Al_xO_y$ layer 26 at the $Al/Ta_2O_5$ ($TiO_2$) interface. FIG. 2 shows a cross-sectional view of the MEMS switch device 10 in the "on" state position having an interfacial oxide layer 26, and FIG. 3 shows a more detailed illustration of the interfacial oxide layer 26 of MEMS switch 10 and the dielectric stack 28 formed by the interfacial oxide layer 26 and dielectric 18.

The presence of the $Al_xO_y$ interfacial layer 26 makes the dielectric stack 28 appear and function as two serially connected capacitors with the dielectrics $Al_xO_y$ (interfacial layer 26) and $Ta_2O_5$ (dielectric material 18). The effective dielectric of the stack, $\in_{eff}$ is represented by Equation 4 below:

Equation 4:
$$\varepsilon_{\mathit{eff}} = \frac{(D_i + D_t)\varepsilon_i\varepsilon_t}{\varepsilon_i D_t + \varepsilon_t D_i}$$

where $\in_i$ and $\in_t$ are the relative dielectric constants of bulk $Al_xO_y$ and $Ta_2O_5$, $D_i$ is the thickness of interfacial layer 26 and $D_t$ is the thickness of the dielectric material 18. Because $Al_2O_3$ and its sub-oxide $Al_xO_y$ have relatively low dielectric constants, in the range of approximately 7.5–9.6, depending on the thickness of this interfacial aluminum oxide layer, the overall capacitance of the dielectric stack 28 may be significantly reduced. For a MEMS RF capacitive switch device, this capacitance reduction is highly undesirable.

Figure 4:
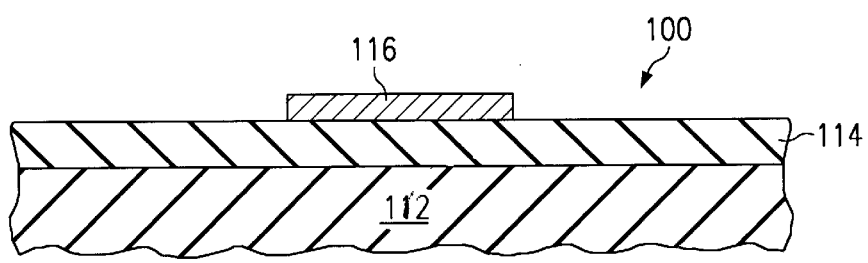
FIGS. 4–6 show manufacturing process steps of the MEMS switch of the present invention.

The present invention solves the dielectric stack 28 lowered capacitance problem due to the interfacial oxide layer 26 of the prior art. FIGS. 4–8 illustrate an exemplary embodiment of the best mode of the present invention. An insulator 114 is disposed over a substrate 112, and a bottom electrode 116 preferably comprising a low resistive metal such as Al is formed on the insulator 114 (FIG. 4). Forming the bottom electrode 116 may include several processing steps, such as depositing a metal layer, and patterning and etching the metal layer to form electrode 116 (not shown).

Figure 5:
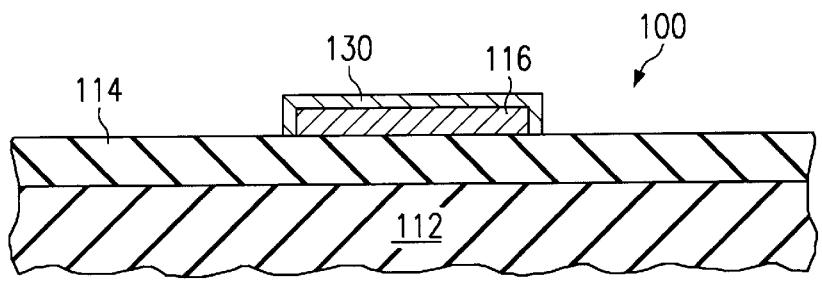
Figure 6:
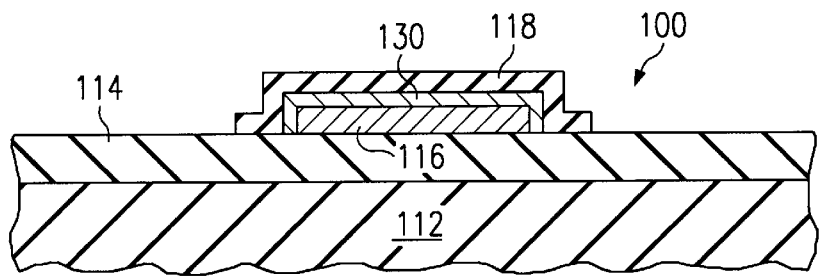

A thin protective layer 130 is deposited and formed on top of the Al metal bottom electrode 116 surface prior to the dielectric 118 deposition (FIG. 5). Preferably, the thin protective layer 130 comprises a material having an associated oxide, which oxide is a high dielectric contant (k) dielectric material (e.g. at least 20). The thin protective layer may comprise, although is not limited to, Ti, Ta or combination of both, for example. Titanium oxide and tantalum oxide are both high k dielectric materials with a dielectric constant of greater than 60 and 21–29, respectively. The protective inter-layer material 130 inhibits the oxidation of the underlying Al bottom electrode 116 and may serve as part of the bottom electrode 116, for example. Furthermore, when the protective inter-layer metal 130 is exposed to oxygen during the subsequent dielectric 118 deposition (FIG. 6), once oxidized, it may form a high k oxide portion 132 at the bottom electrode/dielectric interface that may maintain or increase the overall capacitance of the dielectric stack 128 (FIGS. 7 and 8) (refer to Equation 4). Further processing steps to complete the manufacture of the MEMS switch 100 include forming spacers 120 and membrane or pull-down electrode 122, for example.

Figure 7:
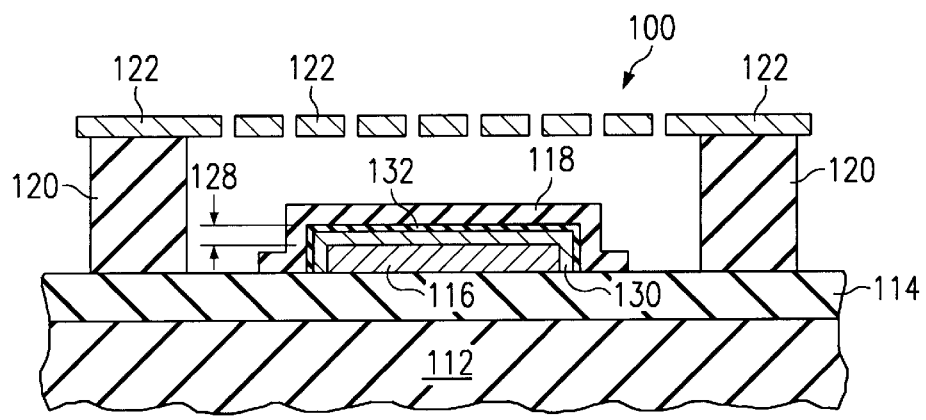
FIG. 7 shows a cross-sectional view of the MEMS switch of the present invention in the "off" position.
Figure 8:
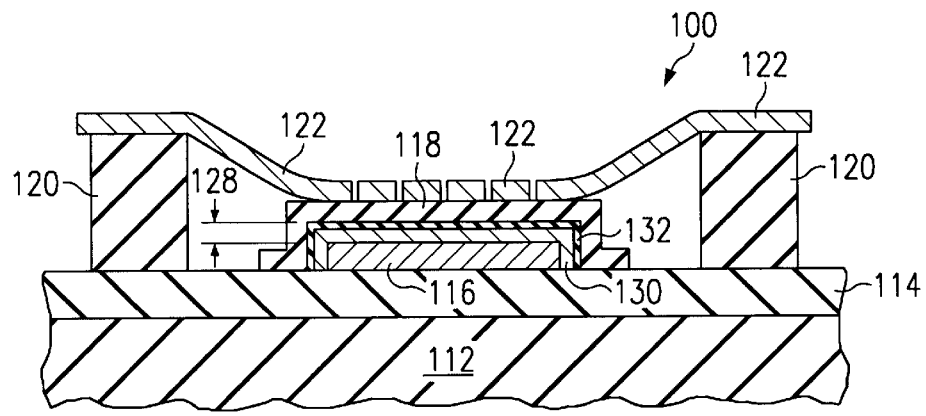
FIG. 8 shows a cross-sectional view of the MEMS switch of the present invention in the "on" position.

Referring to FIG. 7 which shows the "off" position and FIG. 8 which shows the "on" position, shown is a MEMS switch 100 comprising a bottom electrode 116 formed over a substrate 112, a thin protective cap layer 130 disposed over the bottom electrode 116, and a dielectric material 118 disposed over the protective cap layer 130. A spacer 120 is formed proximate the bottom electrode 116, and a pull-down electrode 122 is disposed over the spacer 120 and the dielectric material 118, wherein the protective cap layer 130 prevents the oxidation of the bottom electrode 116. The thin protective cap layer 130 preferably comprises a metal $M_1$ having an associated oxide $M_{1x}O_y$ 132 having a high dielectric constant, for example, at least 20. The thin protective cap layer 130 metal may comprise titanium or tantalum, for example. The bottom electrode 116 may comprise a low resistive metal $M_2$ having an associated oxide $M_{2x}O_y$, wherein the dielectric constant of the oxide $M_{1x}O_y$ is higher than the dielectric constant of the oxide $M_{2x}O_y$. The thin protective cap layer 130 may comprise an oxidized portion 132 that forms upon depositing dielectric material 118. The thin protective cap layer 130 oxidized portion 132 comprises the oxide $M_{1x}O_y$ proximate the dielectric material 118. The thin protective cap layer 130 oxidized portion 132 and the dielectric material 118 comprise a dielectric stack 128, the dielectric stack 128 having a capacitance value. The thin protective cap layer 130 maintains the dielectric stack 128 capacitance value by preventing oxidation of electrode 116 which may causes the low- dielectric constant oxide problematic in the prior art. The thin protective cap layer 130 may also serve to increase the dielectric stack 128 capacitance value.

The novel protective cap layer 130 of the present invention achieves technical advantages by maintaining and/or improving the capacitance of a MEMS dielectric stack 128. The protective cap layer 130 is easily implemented and only requires one more processing step. The invention is particularly useful in MEMS RF switches for wireless communications applications, for example. The protective cap layer 130 prevents the formation of a low-dielectric interfacial layer 26 upon oxidation of the bottom electrode 116 during the dielectric 118 deposition, a problem in the prior art.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, although the invention is described herein with reference to a MEMS RF switch, the present invention is also beneficial for other MEMS devices. It is therefore intended that the appended claims encompass any such modifications or embodiments.

What is claimed is:

1. A Micro Electro-Mechanical System (MEMS) switch, comprising:
   a bottom electrode formed over a substrate;
   a thin protective cap layer disposed over said bottom electrode;
   a dielectric material disposed over said protective cap layer;
   a spacer proximate said bottom electrode; and
   a pull-down electrode over said spacer and said dielectric material, wherein said protective cap layer prevents the oxidation of said bottom electrode.

2. The MEMS switch according to claim 1 wherein said thin protective cap layer comprises a metal.

3. The MEMS switch according to claim 2 wherein said metal comprises a metal $M_1$ having an associated oxide $M_{1x}O_y$ having a high dielectric constant.

4. The MEMS switch according to claim 3 wherein said high dielectric constant is at least 20.

5. The MEMS switch according to claim 4 wherein said metal comprises titanium or tantalum.

6. The MEMS switch according to claim 3 wherein said bottom electrode comprises a metal $M_2$ having an associated oxide $M_{2x}O_y$, wherein the dielectric constant of said oxide $M_{1x}O_y$ is higher than the dielectric constant of said oxide $M_{2x}O_y$.

7. The MEMS switch according to claim 6 wherein said thin protective cap layer comprises an oxidized portion comprising said oxide $M_{1x}O_y$ proximate said dielectric material.

8. The MEMS switch according to claim 7 wherein said thin protective cap layer oxidized portion and said dielectric material comprise a dielectric stack, said dielectric stack having a capacitance value, wherein said thin protective cap layer maintains said dielectric stack capacitance value.

9. The MEMS switch according to claim 8 wherein said thin protective cap layer increases said dielectric stack capacitance value.

10. A Micro Electro-Mechanical System (MEMS) switch, comprising:
    a substrate;
    an insulator layer disposed over said substrate;
    a bottom electrode formed over said insulator layer;
    a thin protective cap layer disposed over said bottom electrode,
    a dielectric material disposed over said thin protective cap layer;
    a spacer proximate said bottom electrode; and
    a pull-down electrode over said spacer and said dielectric material, wherein said thin protective cap layer inhibits the oxidation of said bottom electrode.

11. The MEMS switch according to claim 10 wherein said thin protective cap layer comprises a metal $M_1$ having an associated oxide $M_{1x}O_y$ having a high dielectric constant.

12. The MEMS switch according to claim 11 wherein said high dielectric constant is at least 20.

13. The MEMS switch according to claim 12 wherein said metal comprises titanium or tantalum.

14. The MEMS switch according to claim 11 wherein said bottom electrode comprises a metal $M_2$ having an associated oxide $M_{2x}O_y$, wherein the dielectric constant of said oxide $M_{1x}O_y$ is higher than the dielectric constant of said oxide $M_{2x}O_y$.

15. The MEMS switch according to claim 14 wherein said thin protective cap layer oxidized portion and said dielectric material comprise a dielectric stack, said dielectric stack having a capacitance value, wherein said thin protective cap layer maintains said dielectric stack capacitance value.

16. The MEMS switch according to claim 15 wherein said thin protective cap layer increases said dielectric stack capacitance value.

17. A method of manufacturing a Micro Electro-Mechanical System (MEMS) switch, comprising the steps of:
    providing a substrate;
    depositing an insulator layer on said substrate;
    forming a bottom electrode on said insulator layer;
    depositing a thin protective cap layer over said bottom electrode;
    depositing a dielectric material over said bottom electrode and thin protective cap layer; and
    forming a pull-down electrode over said dielectric material, wherein said thin protective cap layer prevents the oxidation of said bottom electrode.

18. The method according to claim 17 further comprising the step of oxidizing said thin protective cap layer.

19. The method according to claim 18 wherein said oxidizing step comprises forming a high dielectric material.

20. The method according to claim 19 wherein said depositing a thin protective cap layer step comprises depositing a metal $M_1$ having an associated oxide $M_{1x}O_y$, wherein said step of depositing a bottom electrode comprises depositing a metal $M_2$ having an associated oxide $M_{2x}O_y$, wherein the dielectric constant of said oxide $M_{1x}O_y$ is higher than the dielectric constant of said oxide $M_{2x}O_y$.

* * * * *